United States Patent
Baba (10) Patent No.: US 6,348,831 B1
(45) Date of Patent: Feb. 19, 2002

(54) SEMICONDUCTOR DEVICE WITH BACK GATE VOLTAGE CONTROLLERS FOR ANALOG SWITCHES

(75) Inventor: Fujio Baba, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/465,774

(22) Filed: Dec. 17, 1999

(30) Foreign Application Priority Data

Dec. 17, 1998 (JP) ............................................ 10-359797

(51) Int. Cl.[7] .......................................... H03K 17/687
(52) U.S. Cl. ........................................ 327/537; 327/408
(58) Field of Search .............................. 327/537, 534, 327/544, 408, 409, 410, 389, 391

(56) References Cited

U.S. PATENT DOCUMENTS

| | | | |
|---|---|---|---|
| 3,720,848 A | * 3/1973 | Schmidt, Jr. | 327/391 |
| 3,866,064 A | * 2/1975 | Gregory et al. | 327/437 |
| 4,473,761 A | * 9/1984 | Peterson | 327/382 |
| 4,529,897 A | * 7/1985 | Suzuki et al. | 327/541 |
| 4,716,319 A | * 12/1987 | Rebeschini | 327/554 |
| 5,617,055 A | * 4/1997 | Confalonieri et al. | 327/537 |
| 5,880,620 A | * 3/1999 | Gitlin et al. | 327/534 |
| 6,008,689 A | * 12/1999 | Au et al. | 327/534 |

FOREIGN PATENT DOCUMENTS

| | | | |
|---|---|---|---|
| JP | 63-98214 | 4/1988 | ......... H03K/17/687 |
| JP | 2-126426 | 10/1990 | ............ H03H/7/24 |
| JP | 3-48520 | 3/1991 | ......... H03K/17/687 |
| JP | 3-92013 | 4/1991 | ......... H03K/17/687 |
| JP | 5-276001 | 10/1993 | .......... H03K/17/16 |
| JP | 5-327436 | 12/1993 | .......... H03K/17/00 |

* cited by examiner

Primary Examiner—Timothy P. Callahan
Assistant Examiner—Terry L. Englund
(74) Attorney, Agent, or Firm—Foley & Lardner

(57) ABSTRACT

A semiconductor device comprises an analog switch and digital circuitry, both of which are formed on a single integrated circuit chip and share a node coupled to external circuitry. A first power source, provided in the device, is coupled to an input terminal of the analog switch whose output is operatively coupled to the node, and a second power source is also provided so as to supply electric power to the digital circuitry whose input or output is operatively coupled to the node. A back gate voltage controller, coupled to a back gate of the analog switch, is provided in order to control a voltage applied to the back gate in response to an operation mode control signal for determining whether the analog switch or the digital circuitry is to be enabled.

6 Claims, 7 Drawing Sheets

SEMICONDUCTOR DEVICE WITH BACK GATE VOLTAGE CONTROLLERS FOR ANALOG SWITCHES

BACKGROUND OF THE INVENTION

1. Field of the Invention

The present invention relates generally to an integrated circuit (IC) which comprises an analog switch(es) and digital circuitry, both sharing external input and/or output terminals and being coupled to different power sources. More specifically, the present invention relates to such an IC wherein a back gate voltage controller is provided for preventing a leak current flowing through the analog switch while the switch is not in use.

2. Description of the Related Art

It is known in the art to provide, on the identical IC chip, an analog switch(es) and digital circuitry, which are respectively coupled to different power sources.

Figure 1:
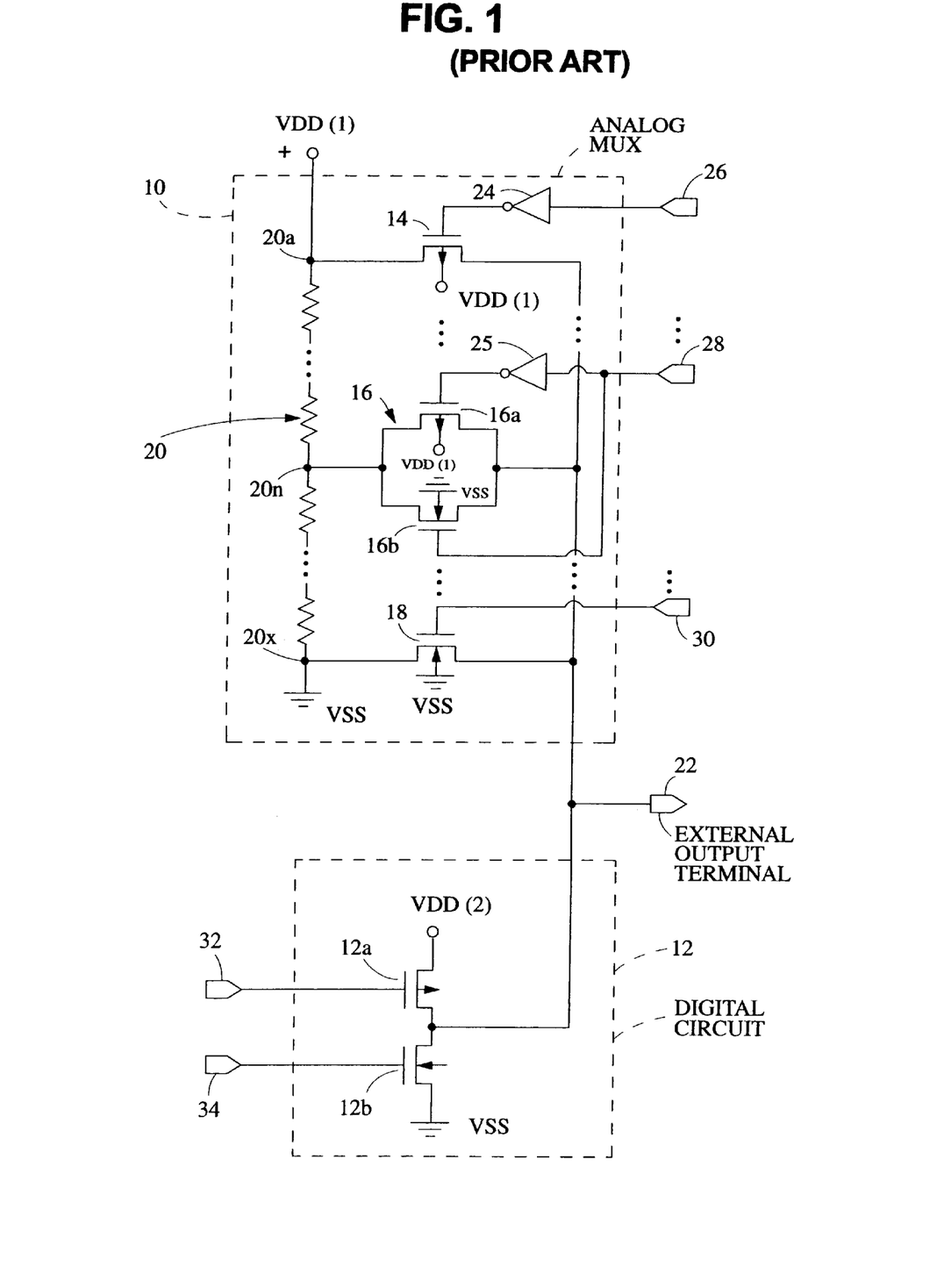
FIG. 1 is a diagram showing a known circuit arrangement relevant to the present invention, having been referred to in the opening paragraphs.
Figure 2:
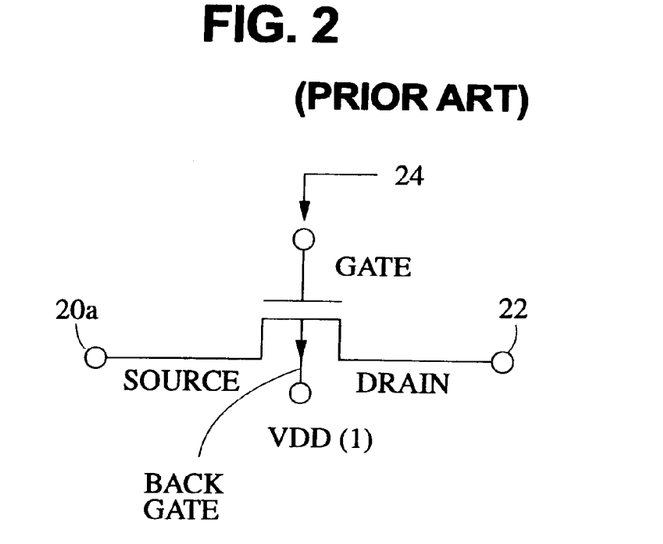
FIG. 2 is a diagram showing a p-channel analog switch used in the arrangement of FIG. 1.
Figure 3:
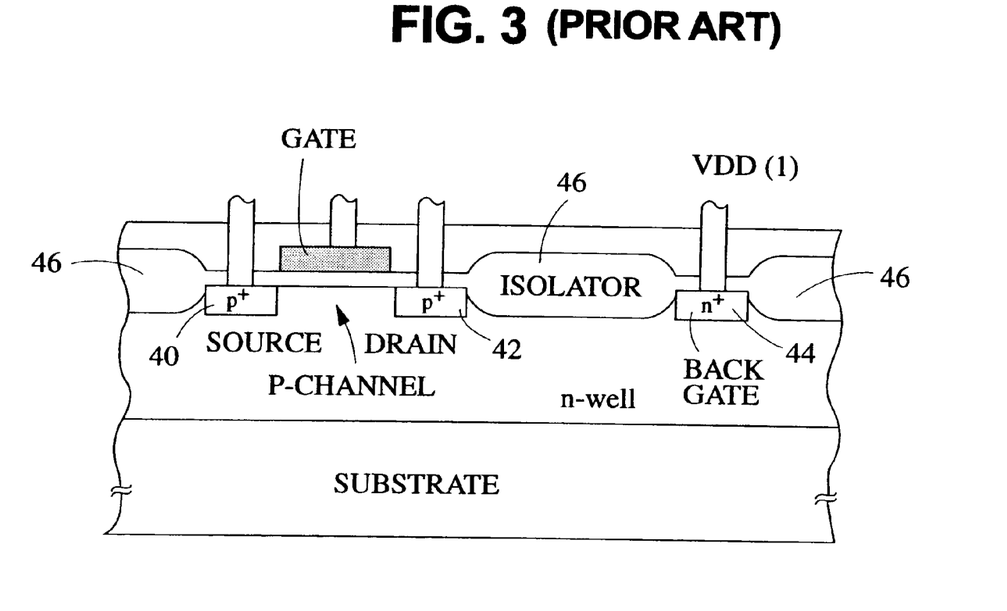
FIG. 3 is a cross-sectional schematic showing the structure of the p-channel analog switch of FIG. 2.

Before turning to the present invention, it is deemed advantageous to briefly describe, with reference to FIGS. 1 to 3, a known circuit relevant to the present invention.

Referring to FIG. 1, there are schematically shown an analog multiplexer 10 and a digital circuit 12 both provided on the same chip. As shown, the analog multiplexer 10 comprises a p-channel analog switch 14, a CMOS (complementary metal oxide semiconductor) analog switch 16, and an n-channel analog switch 18. Although not shown in FIG. 1, one or more other n-channel analog switches may be coupled between the switches 16 and 18. The p-channel analog switch 14 has the source and drain, which are respectively coupled to a voltage divider 20 and an output terminal 22. This output terminal 22 is coupled to external circuitry (not shown) and is shared by the digital circuit 12. The on/off operation of the analog switch 14 is implemented by a digital control signal applied to the gate thereof, via a digital inverter 24, from a gate control terminal 26. The back gate of the analog switch 14 is directly coupled to the power source VDD (1).

The CMOS analog switch 16 is constructed using two paralleled complementary MOSFETs (field-effect transistors) 16a and 16b. The source of the MOSFET 16a is directly coupled to the drain of the MOSFET 16b and the voltage divider 20. On the other hand, the drain of the MOSFET 16a is directly coupled to the source of the MOSFET 16b, and these terminals are coupled to the output terminal 22. The on/off operation of the CMOS analog switch is controlled by a digital control signal applied to the gates of the MOSFETs 16a and 16b from a gate control terminal 28. It is to be noted that each of digital inverters 24 and 25 is provided to reverse the polarity of the gate control signal. The back gates of the MOSFETs 16a and 16b are respectively coupled to the power source VDD(1) and ground VSS.

As in the above-mentioned analog switch 14, the n-channel analog switch 18 has the drain and source, which are respectively coupled to the voltage divider 20 and the output terminal 22. The on/off operation of the analog switch 18 is carried out by a digital control signal applied to the gate thereof from a gate control terminal 30. The back gate of the analog switch 18 is directly coupled to ground VSS.

When the analog multiplexer 10 is used, the digital circuit 12 is not used, and vice versa.

As shown, the digital circuit 12 comprises two complementary MOSFET switches 12a and 12b which are provided in series between a power source VDD(2) and ground VSS.

When the MOSFETs 12a and 12b are respectively turned on and off by applying gate control signals from terminals 32 and 34, the voltage of the power source VDD(2) appears at the output terminal 22. Contrarily, when the MOSFETs 12a and 12b are respectively turned off and on, the output terminal 22 is pulled to ground.

FIG. 2 is a diagram showing the p-channel analog switch 14 of FIG. 1, and FIG. 3 is a cross-sectional schematic of the structure of the switch 14. The configuration of the p-channel analog switch per se is well known in the art and thus only a brief description thereof is given.

As shown in FIG. 3, a p-channel is formed between the source and the drain which are respectively p+ diffusion regions 40 and 42 formed in an n-well. The back gate (denoted by 44) is separated from the active region by forming an isolator 46 and is directly coupled to the power source VDD(1). Assume that the power source VDD(1) is lowered for some reasons such as reducing power dissipation (for example) when the analog multiplexer 10 is not used. In this case, if the digital circuit 12 outputs the power source voltage (vix., VDD(2)), a current undesirably flows from the drain 42 and the source 40 to the back gate 44 because the p–n junction therebetween is forward biased. Therefore, according to the related are in question, the power source VDD(1) should not be lowered (vix., kept to be applied to the back gate 44) even if the analog multiplexer 10 is not in use.

Japanese Laid-open Patent Application No. 5-276001 discloses an analog switch circuit wherein an n-channel transistor has a substrate that is selectively coupled to ground via an n-channel transistor. However, this related art fails to disclose a combination of an analog switch and digital circuitry, both sharing external input and/or output terminals and being coupled to different power sources.

However, it is highly desirable that when the analog switch is not utilized while the digital circuitry is utilized, the analog input voltage can be lowered for the purpose of power conservation.

SUMMARY OF THE INVENTION

It is therefore an object of the present invention to provide a back gate voltage controller for preventing a leak current when an analog switch is not in use even if an analog power source is lowered.

One aspect of the present invention resides in a semiconductor device comprising an analog switch and digital circuitry, both being formed on a single integrated circuit chip and sharing a node coupled to external circuitry, comprising: a first power source coupled to an input terminal of the analog switch whose output is operatively coupled to the node; a second power source for supplying electric power to the digital circuitry whose input or output is operatively coupled to the node; and a back gate voltage controller, coupled to a back gate of the analog switch, for controlling a voltage applied to the back gate in response to an operation mode control signal for determining whether the analog switch or the digital circuitry is to be enabled.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

Figure 4:
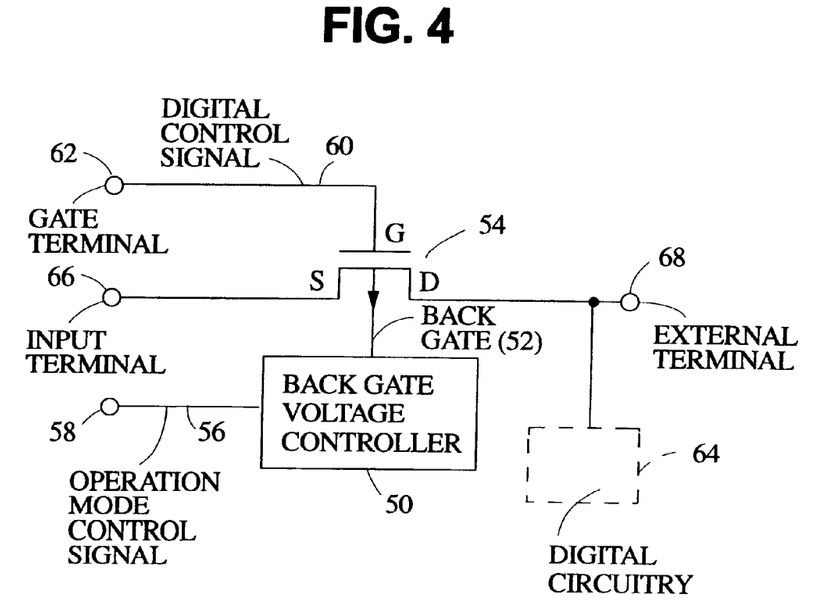
FIG. 4 is a diagram showing a back gate voltage controller representing the underlying principle of the present invention wherein the controller is operatively coupled to the back gate of a p-channel analog switch.

A brief description of the present invention will be given with reference to FIG. 4. A back gate voltage controller 50 is operatively coupled to the back gate 52 of a p-channel analog switch 54 so as to control the voltage thereof in response to an operation mode control signal 56 received via a terminal 58. The operation mode control signal 56 determines whether the analog switch 54 is to be used or not. The analog switch 54 remains inoperative as long as a digital control signal 60 applied to the gate of the switch 54 via a gate terminal 62 is kept high, in the case of which the digital circuitry 64 is in turn utilized.

While the analog switch 54 is in use, the switch 54 is turned on or off in response to the digital control signal 60. When the analog switch 54 is turned on, an analog voltage applied to an input terminal 66 appears at an external terminal 68. The back gate voltage controller 50 continues to apply the analog power voltage VDD(1) (FIG. 1) to the back gate 52 as long as the switch 54 remains in use.

When the analog switch 54 is rendered inoperative in response to the digital control signal 60 assuming a high level, the back gate voltage controller 50 isolates the back gate 53 or applies a lower voltage (vix., digital power voltage VDD(2)) to the back gate 52. When the back gate 52 is isolated from the VDD(1), it is possible to reduce the power of the source VDD(1) less than a possible high voltage at the external terminal 68. This is because there exists no possibility of inviting a forward-biased p–n junction between the drain and the back gate 52 and also between the source and the back gate 52.

Figure 5:
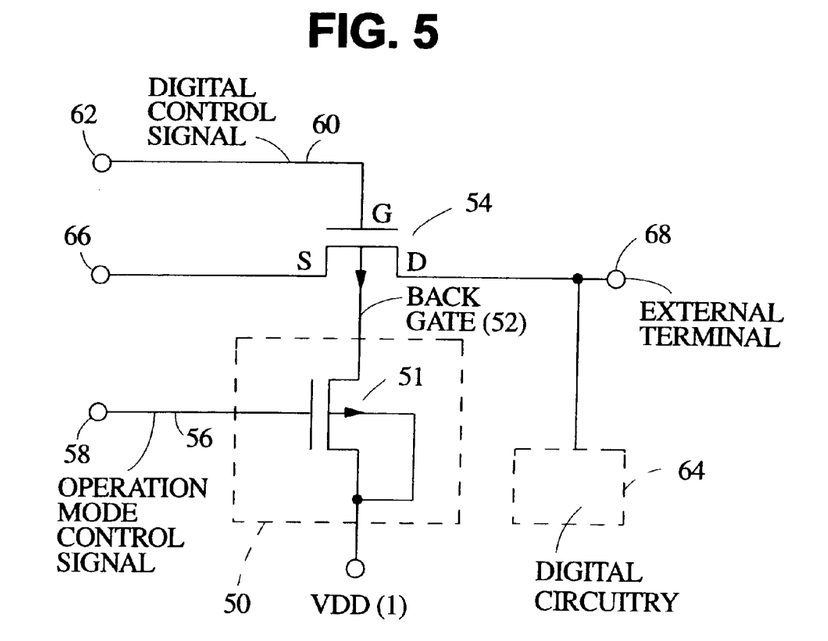
FIG. 5 is a diagram showing a first embodiment of the present invention, via which a back gate of the p-channel analog switch is floated or isolated.

A first embodiment of the back gate voltage controller 50 will be described with reference to FIG. 5. The back gate voltage controller 50 of the first embodiment takes the form of a p-channel analog switch 51. While the analog switch 54 is in use, the switch 51 remains closed and thus, the back gate 52 is directly coupled to the analog power source VDD(1). On the other hand, while the analog switch 54 is not used, the switch 51 is turned off so as to isolate the back gate 52. This means that the voltage of the power source VDD(1) can be pulled down to ground (for example) for the purpose of power conversation.

Figure 6:
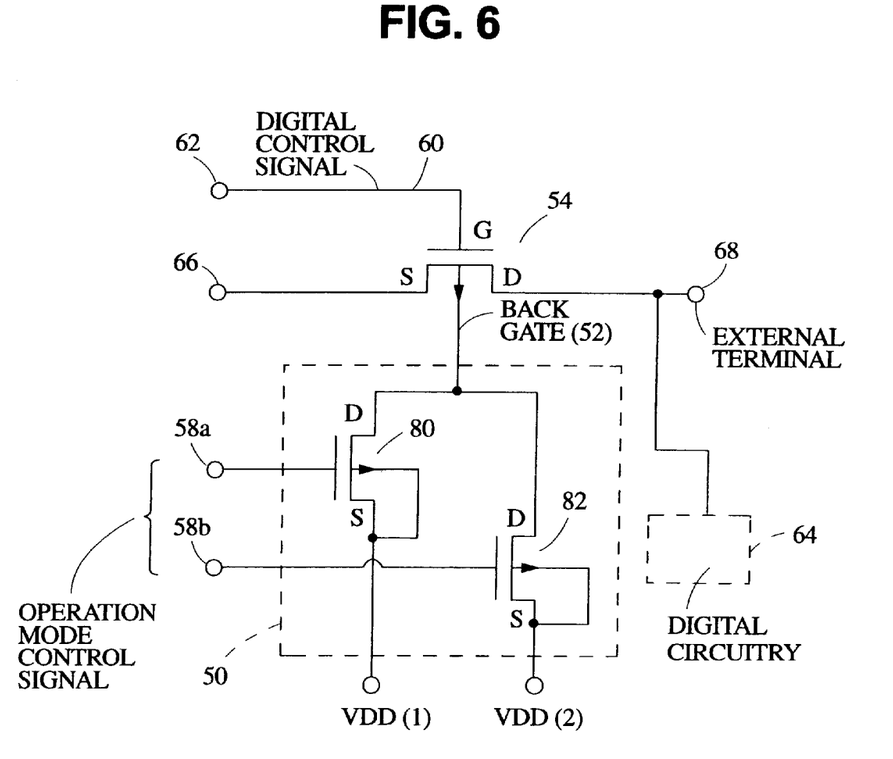
FIG. 6 is a diagram showing a second embodiment of the present invention for sequentially changing power supply to a back gate from an analog (first) power source to a digital (second) power source lower than the analog power source.

A second embodiment of the back gate voltage controller 50 will be described with reference to FIG. 6 The back gate voltage controller 50 of the instant embodiment comprises two p-channel analog switches 80 and 82. The switch 80 is provided between the back gate 52 and the power source VDD(1), while the other switch 82 is provided between the back gate 52 and the power source VDD(2). While the analog switch 54 is in use, the switches 80 and 82 are respectively turned on and off in response to the operation mode control signal applied to terminals 58a and 58b. Therefore, the power source VDD(1) is coupled to the back gate 52 while the analog switch 54 is utilized. On the other hand, when the analog switch 54 should be rendered inoperative and the digital circuitry 64 is to be used, the switches 80 and 82 are respectively turned off and on. Accordingly, the back gate 52 is then coupled to the power source VDD(2) whose voltage is equal to or lower than that of the power source VDD(1). This means that the analog power source VDD(1) can be lowered to VDD(2). In the above, when the switches 80 and 82 are respectively turned off and on, it is preferable to delay the "turn-on" time point of the switch 82 in order to ensure that the switches 80 and 82 are not simultaneously conductive.

Figure 7:
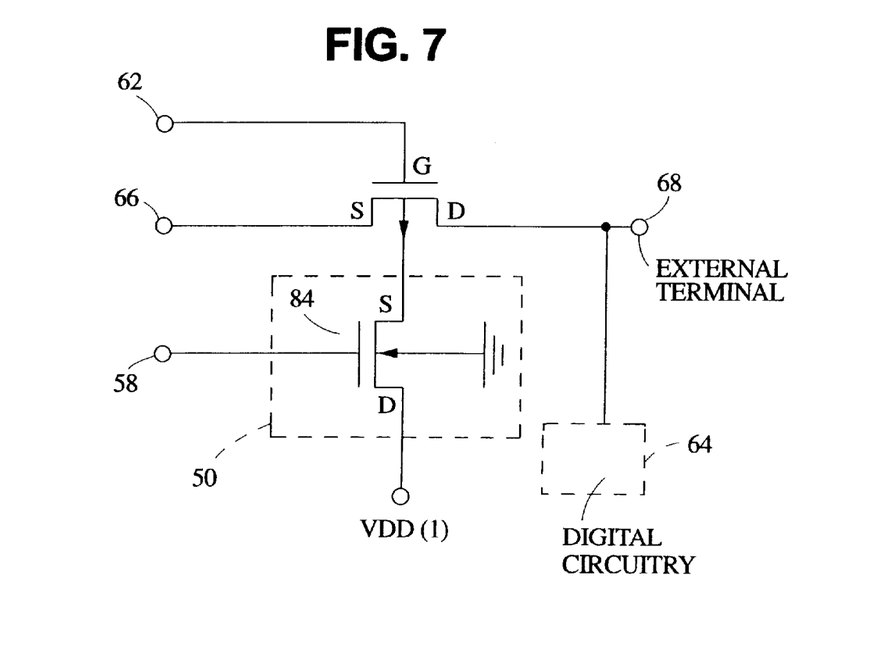
FIG. 7 is a diagram showing third embodiment of the present invention wherein a n-channel MOSFET switch is used as the back gate voltage controller for isolating the back gate from the analog power source.

A third embodiment of the back gate voltage controller 50 will be described with reference to FIG. 7. The back gate voltage controller 50 of the third embodiment is an n-channel analog switch 84. The operation of the third embodiment is substantially identical with that of the first embodiment, and thus a further description thereof is deemed redundant and accordingly omitted for simplifying the disclosure.

In the following, three examples of the application of the present invention to actual circuits will be described with respect to FIGS. 8 to 10.

Figure 8:
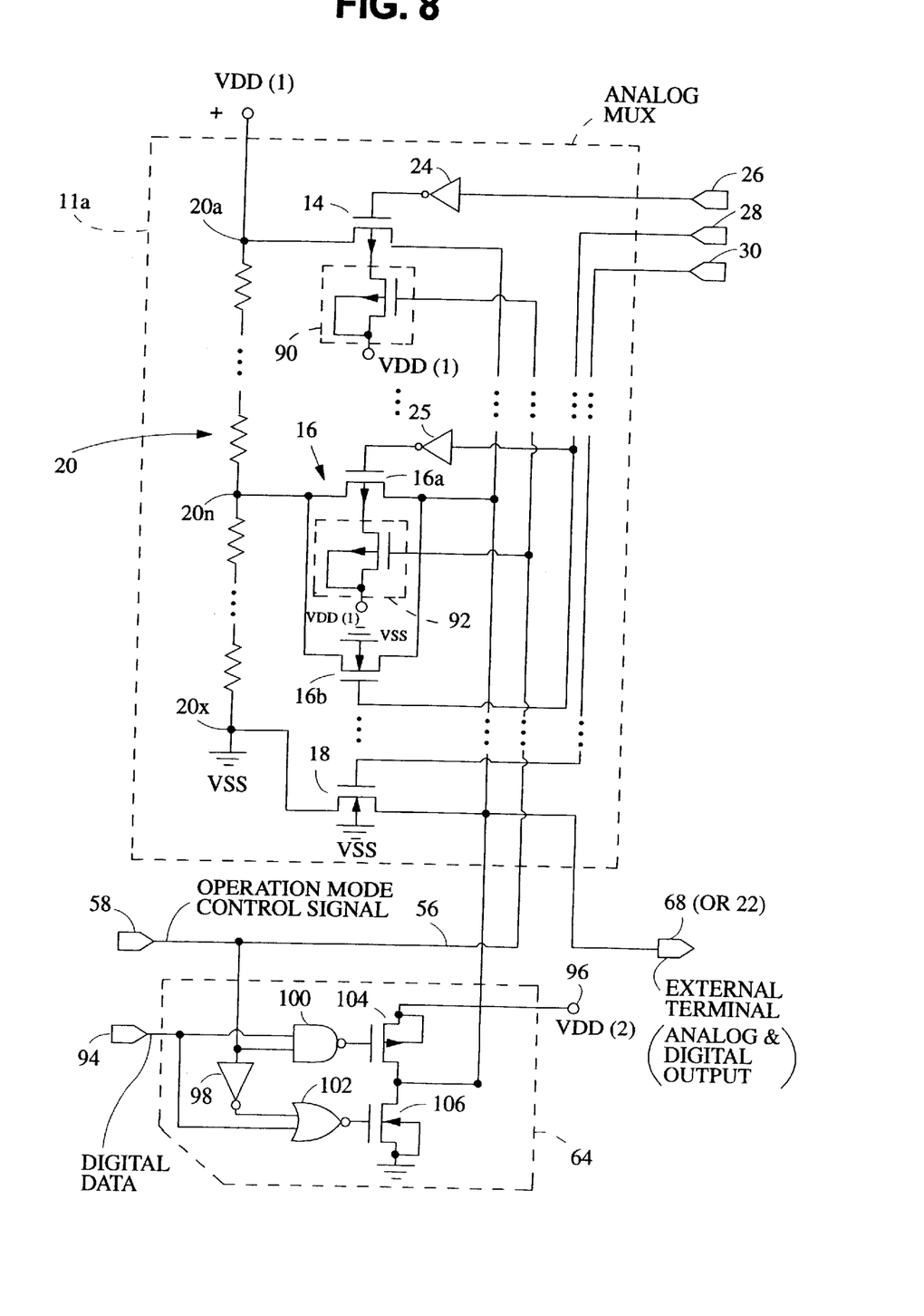
FIG. 8 is a diagram showing a first example of application of the present invention to concrete circuitry.

A first example of the application of the present invention is shown in FIG. 8. An analog multiplexer 11a of FIG. 8 comprises two back gate voltage controllers 90 and 92 each of which is identical with the controller 50 shown in FIG. 5. Other than this, the analog multiplexer 11a is substantially identical to that of FIG. 1, and thus the descriptions of the portions already referred to in connection with FIG. 1 will be omitted for simplifying the instant disclosure except for becoming necessary in context.

When the analog multiplexer 11a is to be used, the operation mode control signal 56 assumes a low level so as to bring the multiplexer 11a into operation. That is, the back gate of each of the analog switches 14 and 16a is allowed to be coupled to the analog power source VDD(1). Thus, the multiplexer 11a is able to selectively output an analog signal by way of the analog switch selected by the digital control signal appearing on one of the terminals 26, 28, and 30. The analog signal thus selected appears on the external terminal 68. In the above operation mode, as mentioned above, the digital circuitry 64 remains inoperative.

On the contrary, if the digital circuitry 64 should be used, the operation mode control signal 56 assumes a high level and thus, the analog multiplexer 11a is rendered inoperative and the digital circuitry 64 is brought into operation. The digital circuitry 64 is coupled to an input terminal 94 to which digital binary data is applied, and a terminal 96 coupled to the digital power source VDD(2). The digital circuitry 64 comprises an inverter 98, a NAND gate 100, a NOR gate 102, a p-channel switch 104, and a n-channel 106.

It is clearly understood that since the operation mode control signal 56 is high, if the digital data assumes a high level, the digital circuitry 64 issues a high level (vix., power source voltage VDD(2)). Contrarily, if the digital data assumes a low level, the digital circuitry 64 issues a ground level signal. These outputs of the digital circuitry appear at the external terminal 68. In the above, when the digital circuitry 64 outputs the power source level VDD(2), each of the gate control voltage controllers 90 and 92 has already become turned off and thus, no leak current flows through the corresponding analog switch (14 or 16a) as mentioned in the above. It is understood that the external terminal 68 of FIG. 8 is used in common for providing either analog or digital output.

Figure 9:
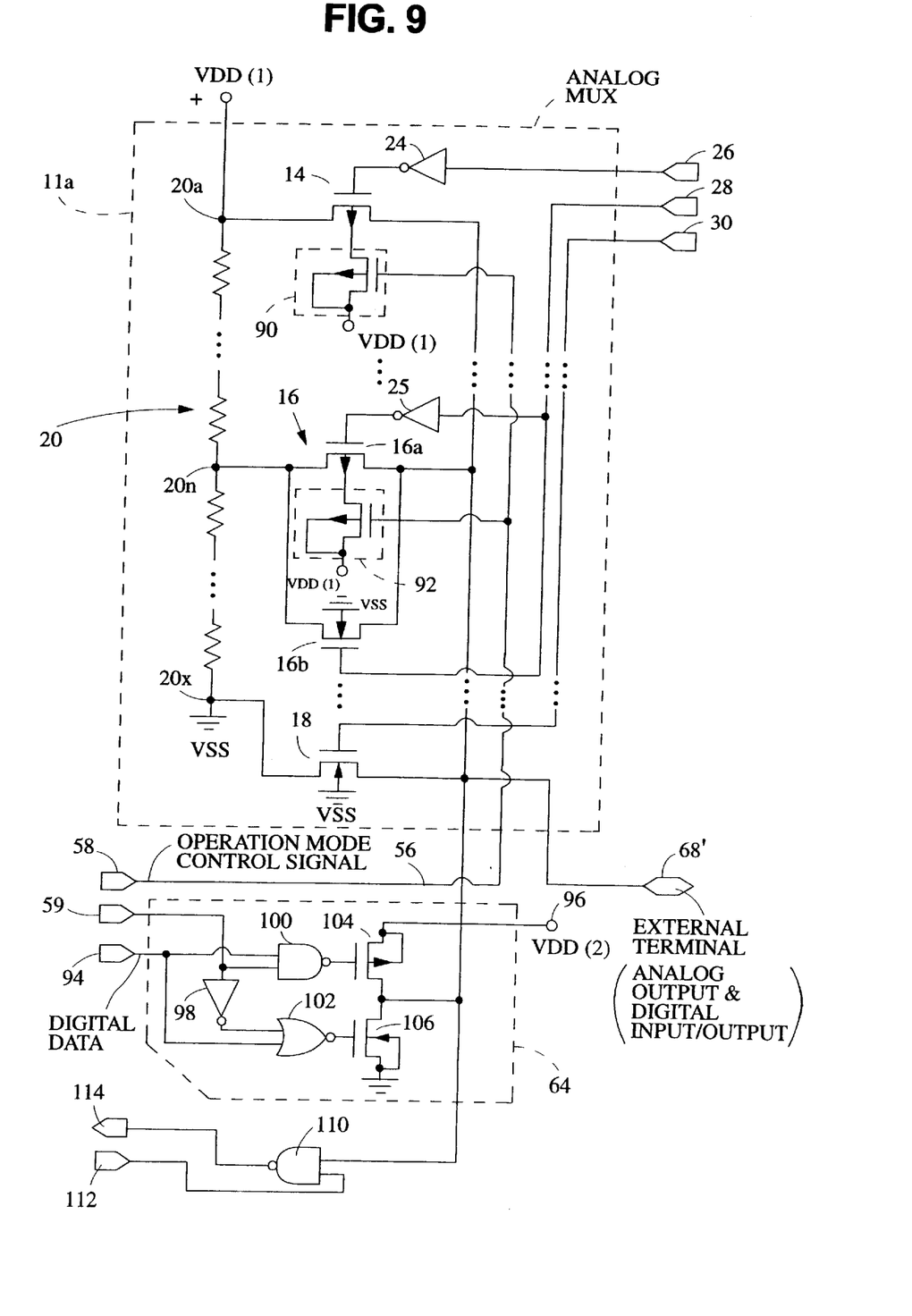
FIG. 9 is a diagram showing a second example of application of the present invention to concrete circuitry.

FIG. 9 shows a second example of the application of the present invention to concrete circuitry, which differs from the arrangement of FIG. 8 with respect to the following: (a) the arrangement of FIG. 9 further comprises a NAND gate 110, (b) an operation mode control terminal 59 is added, and (c) the operation mode control signal 56 is not applied to the digital circuit 64. Further, an operation mode control signal for the NAND gate 110 is applied to a terminal 112, and the output of the NAND gate 110 is obtained at a terminal 114. It is understood that while an operation mode control signal applied to the terminal 112 assumes a high level, the NAND gate 110 continues to issue a high level irrespective of a logical level applied via the external output terminal 68'. In this case, the NAND gate 110 falls into the inoperative mode thereof.

As mentioned above, the analog multiplexer 11a becomes operative when the operation control signal 56 assumes a low level. In this case, the mode control signal applied to the terminal 59 should assume a low level in order to make the digital circuitry 64 inoperative, while a mode control signal applied to the terminal 112 should assume a high logical level in order to render the NAND gate 110 inoperative. Thus, the analog voltage selected by the analog multiplexer 11a is applied to an external terminal 68'.

From the foregoing, it is understood that only one of the circuits 11a, 64, and 110 is rendered operative by selecting the logical level of the corresponding operation mode control signal. The external terminal 68' is used to pass therethrough the analog output of the multiplexer 11a or the digital output of the circuit 64, or the digital input for the NAND gate 110.

As in the first example shown in FIG. 8, even if the digital circuitry 64 outputs the power source level VDD(2) or if the NAND gate 110 receives a high level reaching the power source level VDD(2), since each of the gate control voltage controllers 90 and 92 has already become turned off, no leak current flows through the corresponding analog switch (14 or 16a).

Figure 10:
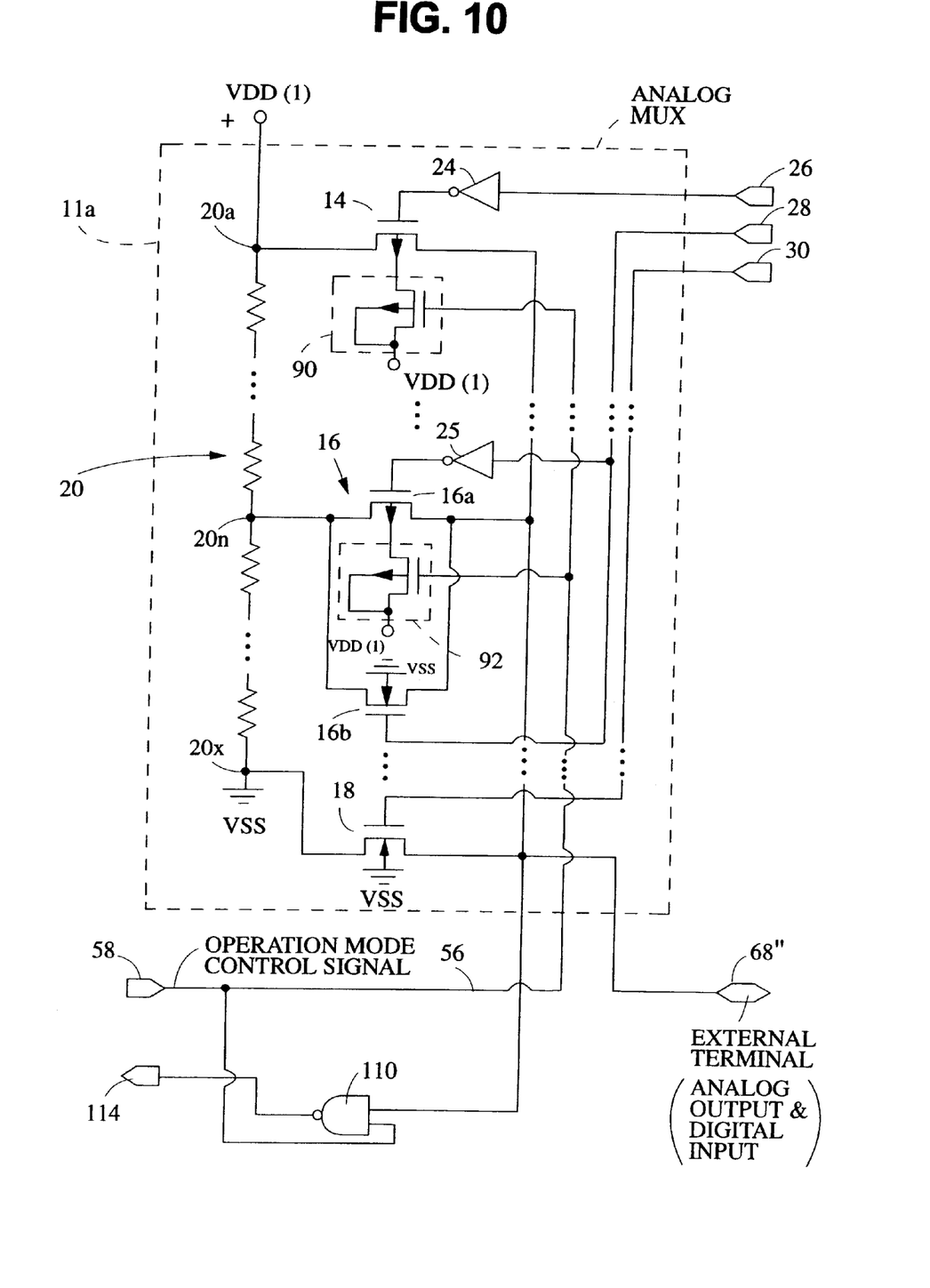
FIG. 10 is a diagram showing a third example of application of the present invention to concrete circuitry.

FIG. 10 shows a third example of the application of the present invention to concrete circuitry, which differs from the preceding example of FIG. 9 in that the digital circuitry 64 is deleted in FIG. 10. Further, the operation mode control signal 56 is also applied to one of the inputs of the NAND gate 110. Other than this, the arrangement of FIG. 10 is substantially identical to that of FIG. 9. The operation of the circuit of FIG. 10 is clearly appreciated from the foregoing, and thus, further descriptions thereof will be omitted for brevity.

It will be understood that the above disclosure is representative of several possible embodiments of the present invention and that the concept on which the invention is based is not specifically limited thereto.

What is claimed is:

1. A semiconductor device comprising an analog switch and digital circuitry, both being formed on a single integrated circuit chip and sharing a node coupled to external circuitry comprising:

a first power source coupled to an input terminal of said analog switch whose output is operatively coupled to said node;

a second power source for supplying electric power to said digital circuitry whose input or output is operatively coupled to said node; and a back gate voltage controller, coupled to a back gate of said analog switch for controlling a voltage applied to said back gate in response to an operation mode control signal which represents whether said analog switch or said digital circuitry is to be enabled, said operation mode control signal coupled to said digital circuitry for enabling/disabling said digital circuitry while disabling/enabling said analog switch; and said back gate voltage controller is operative to clamp the voltage of said back gate to said first power source while said analog switch is in use, and to isolate said back gate from the first power source when said analog switch is not in use.

2. The semiconductor device as claimed in claim 1, wherein said back gate voltage controller comprises a p-channel MOSFET (metal oxide semiconductor field effect transistor) switch and is provided between said back gate and said first power source, said p-channel MOSFET switch clamping the voltage of said back gate to said first power source while said analog switch is in use and floating said back gate while said analog switch is not in use.

3. The semiconductor device as claimed in claim 1, wherein said back gate voltage controller comprises first and second p-channel MOSFET switches, said first p-channel MOSFET switch is provided between said back gate and said first power source, said second p-channel MOSFET switch being provided between said back gate and said second power source, said first p-channel MOSFET switch clamping the voltage of said back gate to said first power source while said analog switch is in use and isolating said back gate from said first power source while said analog switch is not in use, and said second p-channel MOSFET switch operating so as to clamp the voltage of said back gate to said second power source while said analog switch is not in use.

4. The semiconductor device as claimed in claim 1, wherein said back gate voltage controller comprises a n-channel MOSFET switch and is provided between said back gate and said first power source, said n-channel MOSFET switch clamping the voltage of said back gate to said first power source while said analog switch is in use and floating said back gate while said analog switch is not is use.

5. The semiconductor device as claimed in claim 3, wherein when said analog switch is to be brought into inoperative operation, said first p-channel MOSFET isolates said back gate from said first power source and, after a predetermined time period elapses from the isolation of said back gate from said first power source, said second p-channel MOSFET clamps the voltage of said back gate to said second power source.

6. A method for enabling/disabling circuitry in a semiconductor device comprising an analog switch and digital circuitry, both being formed on a single integrated circuit chip and sharing a node coupled to external circuitry comprising:

providing a first power source coupled to an input terminal of said analog switch whose output is operatively coupled to said node;

providing a second power source for supplying electric power to said digital circuitry whose input or output is operatively coupled to said node; and providing a back gate voltage controller, coupled to a back gate of said analog switch for controlling a voltage applied to said back gate in response to an operation mode control signal which represents whether said analog switch or said digital circuitry is to be enabled, said operation mode control signal coupled to said digital circuitry for enabling/disabling said digital circuitry while disabling/enabling said analog switch, and said back gate controller operative for clamping the voltage of said back gate to said first power source while said analog switch is in use, and operative to float said back gate when said analog switch is not in use.

* * * * *